(12) United States Patent
Liu

(10) Patent No.: US 11,747,367 B2
(45) Date of Patent: Sep. 5, 2023

(54) CURRENT SENSOR

(71) Applicants: Kabushiki Kaisha Toshiba, Tokyo (JP); Toshiba Electronic Devices & Storage Corporation, Tokyo (JP)

(72) Inventor: Jia Liu, Yokohama (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 5 days.

(21) Appl. No.: 17/410,196

(22) Filed: Aug. 24, 2021

(65) Prior Publication Data

US 2022/0065898 A1   Mar. 3, 2022

(30) Foreign Application Priority Data

Aug. 28, 2020   (JP) ................. 2020-144909

(51) Int. Cl.
*G01R 15/20* (2006.01)
*G01R 19/00* (2006.01)

(52) U.S. Cl.
CPC ......... *G01R 15/202* (2013.01); *G01R 15/207* (2013.01); *G01R 19/0092* (2013.01)

(58) Field of Classification Search
CPC . G01R 15/202; G01R 15/207; G01R 19/0092
See application file for complete search history.

(56) References Cited

U.S. PATENT DOCUMENTS

| | | | |
|---|---|---|---|
| 2015/0160272 A1* | 6/2015 | Juds | H01H 33/027 324/244 |
| 2018/0372810 A1* | 12/2018 | Jiang | G01R 33/0035 |
| 2019/0018046 A1* | 1/2019 | Shimizu | G01R 31/382 |

FOREIGN PATENT DOCUMENTS

| | | |
|---|---|---|
| CN | 111562420 A | 8/2020 |
| JP | 2001-339109 A | 12/2001 |
| JP | 2010-101871 A | 5/2010 |
| JP | 4515855 B2 | 8/2010 |
| JP | 2012-98205 A | 5/2012 |
| JP | 6007381 B2 | 10/2016 |

* cited by examiner

*Primary Examiner* — Dominic E Hawkins
(74) *Attorney, Agent, or Firm* — Allen & Overy LLP

(57) ABSTRACT

A current sensor of an embodiment includes a U-shaped conductor through which a current flows, a first magnetic field sensor configured to receive a magnetic field generated by the conductor in a first direction, and a second magnetic field sensor configured to receive the magnetic field in a second direction opposite to the first direction.

8 Claims, 2 Drawing Sheets

CURRENT SENSOR

CROSS-REFERENCE TO RELATED APPLICATIONS

This application is based upon and claims the benefit of priority from the prior Japanese Patent Application No. 2020-144909 filed on Aug. 28, 2020; the entire contents of which are incorporated herein by reference.

FIELD

An embodiment of the present invention relates to a magnetic field sensing type current sensor.

BACKGROUND

A magnetic field sensing type current sensor senses a current in such a way that when a current flows through a conductor, a magnetic field generated by the conductor is sensed with a magnetic field sensor.

A current sensor is known that includes two magnetic field sensors arranged at positions to receive a magnetic field generated by a conductor in opposite directions, thereby sensing a current with little influence of an external magnetic field (noise).

DETAILED DESCRIPTION

Figure 1:
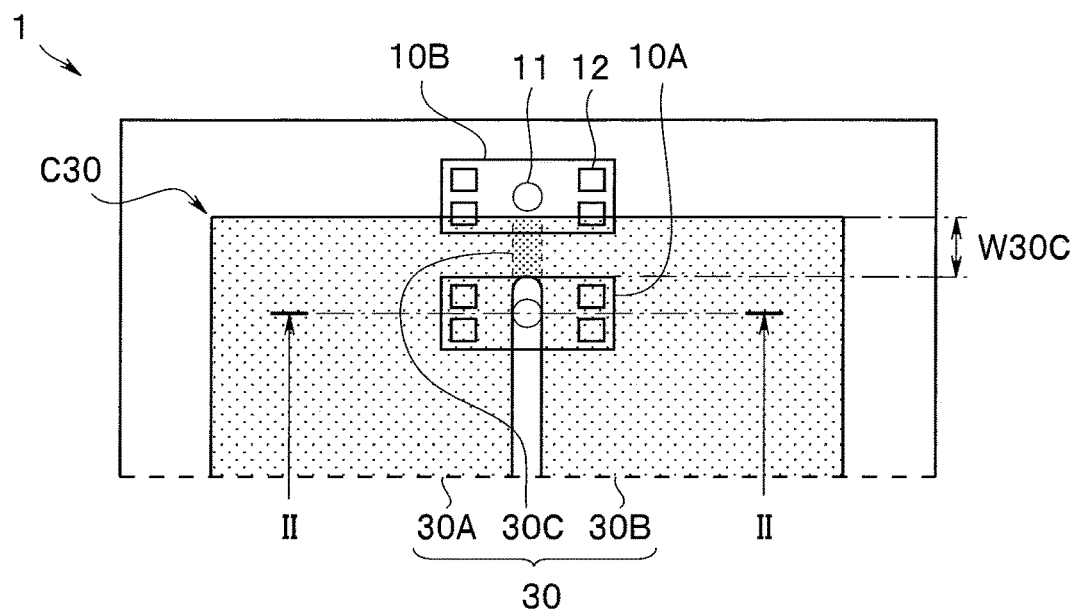
FIG. 1 is a plan view for illustrating an arrangement of a main part of a current sensor of an embodiment.

A current sensor of an embodiment includes a conductor including a first region, a second region, and a third region connecting an end of the first region and an end of the second region; a first magnetic field sensor configured to receive a magnetic field generated by the conductor in a first direction; and a second magnetic field sensor configured to receive the magnetic field in a second direction opposite to the first direction, in which the first magnetic field sensor and the second magnetic field sensor are arranged facing each other with the third region interposed between the first magnetic field sensor and the second magnetic field sensor, and a magnetism sensing portion of each of the first magnetic field sensor and the second magnetic field sensor does not overlap with the conductor.

Hereinafter, a current sensor 1 of an embodiment will be described in detail with reference to the drawings.

Note that the drawings based on the embodiment are schematic, and thus, the relationship between the thickness and the width of each portion, the proportion of the thickness of each portion, the relative angle of each portion, and the like differ from the actual relationship, proportion, relative angle, and the like. Different drawings include portions with different dimensional relationships or proportions. In addition, illustration and reference numerals of some of components are omitted.

Figure 2:
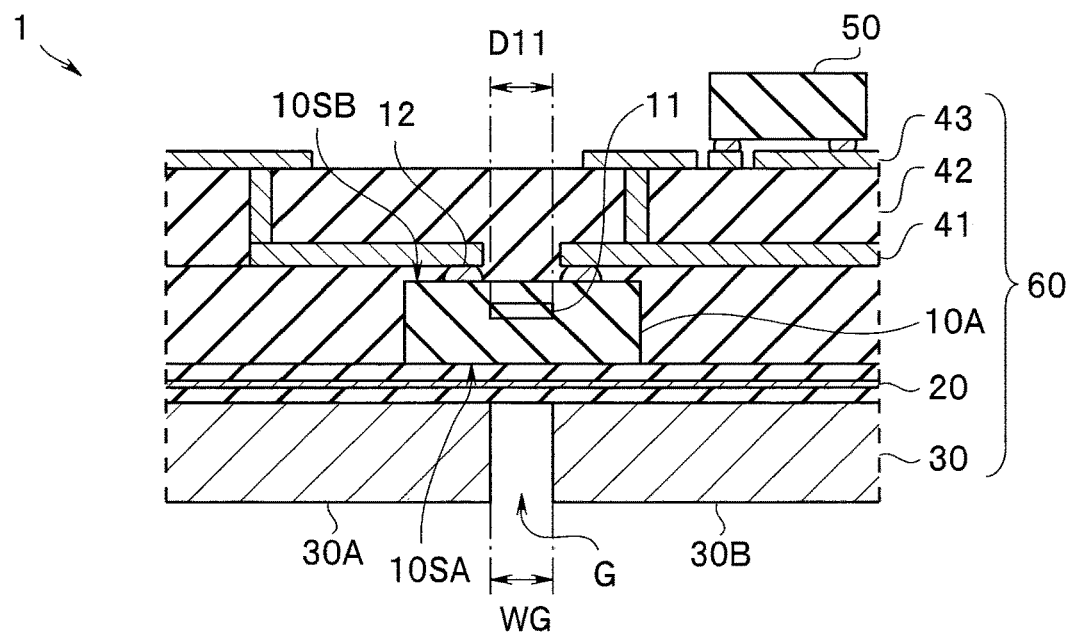
FIG. 2 is a cross-sectional view along line II-II of FIG. 1.
Figure 3:
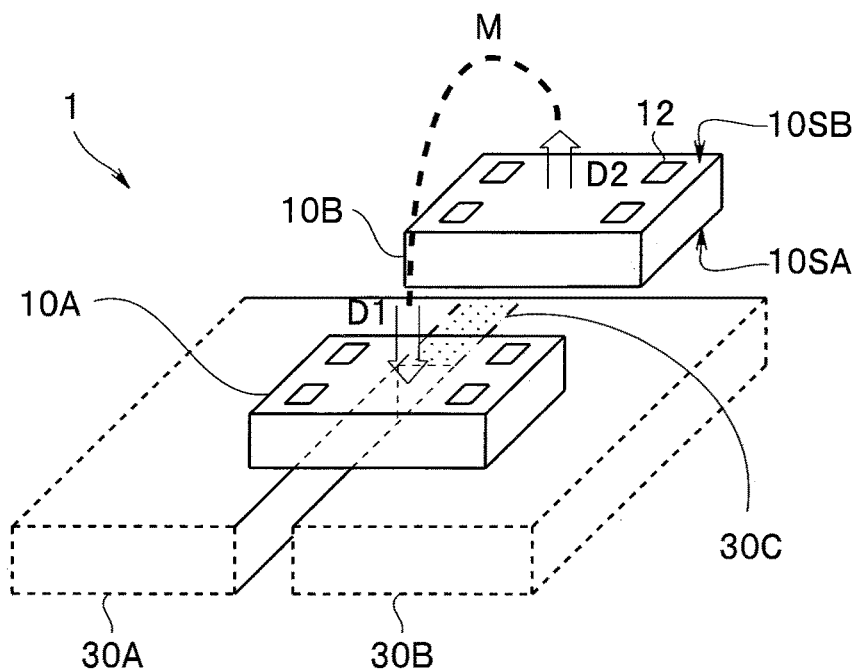
FIG. 3 is a perspective view of the main part of the current sensor of the embodiment.

As illustrated in FIGS. 1 to 3, the current sensor 1 includes a U-shaped conductor 30 through which a current flows, a first magnetic field sensor 10A configured to receive a magnetic field generated by the conductor 30 in a first direction D1, and a second magnetic field sensor 10B configured to receive the magnetic field in a second direction D2 opposite to the first direction D1.

A shielding layer 20 is arranged between the magnetic field sensors 10 (i.e., the first magnetic field sensor 10A and the second magnetic field sensor 10B) and the conductor 30. For example, the shielding layer 20 made of a copper sheet is connected to a ground potential line. The shielding layer 20 shields the magnetic field sensors 10 and a peripheral circuit, such as an electronic component 50 described below, from electromagnetic noise. The shielding layer 20 further has an effect of suppressing an eddy current, and thus contributes to improving band characteristics. The thickness of the shielding layer 20 is 0.1 μm, for example, but the shielding layer 20 may be an even thinner vapor-deposited film with a thickness on the order of nanometers. A material of the shielding layer may be any conductive material, such as aluminum.

The conductor 30 is one of conductor layers of a multi-layer wiring board 60 that includes a plurality of conductor layers (for example, conductor layers 41 and 43) and a plurality of insulating layers (for example, an insulating layer 42).

The multi-layer wiring board 60 may be either a wiring board stacked on a single substrate or a wiring board obtained by bonding a plurality of substrates together. For example, the insulating layer 42 may be a substrate of a wiring board having the conductor layers 41 and 43 disposed on opposite faces of the wiring board. Although the multi-layer wiring board 60 illustrated herein is rectangular in shape, the multi-layer wiring board 60 may also be circular in shape, for example. The multi-layer wiring board 60 incorporates the magnetic field sensors 10, and has at least one surface-mounted electronic component 50, such as an IC chip.

The U-shaped conductor 30 includes a first region 30A, a second region 30B, and a third region 30C connecting an end of the first region 30A and an end of the second region 30B. An end portion of each of the first region 30A and the second region 30B, which are substantially rectangular in shape, is provided with a connector (not illustrated) into which a current flows. The first region 30A and the second region 30B are arranged facing each other with a gap G between the first region 30A and the second region 30B. A distance WG of the gap G corresponds to a length of a current flow path of the third region 30C.

The conductor 30 having the gap G is produced by a copper sheet etching process (i.e., a subtractive method) or a pattern copper plating (i.e., an additive method), for example. Since the U-shaped conductor 30 has a small area, the current sensor 1 is also small. In addition, the U-shaped conductor 30 has lower electric resistance than a conductor with a plurality of folded portions.

A distribution of a magnetic field generated by the conductor 30 varies according to a cross-sectional area (i.e., the thickness and the width) of the conductor. Although the thickness of the conductor 30 is uniform, a width W30C of the current flow path of the third region 30C is narrower than a width of a current flow path of the first region 30A and a width of a current flow path of the second region 30B. Therefore, the third region 30C applies a magnetic field, which is stronger than magnetic fields from the first region 30A and the second region 30B, to the magnetic field sensor 10.

The magnetic field sensors 10 are Hall elements configured to sense a current (DC or AC) flowing through the conductor 30.

The first magnetic field sensor 10A and the second magnetic field sensor 10B are arranged facing each other with the third region 30C interposed between the first magnetic field sensor 10A and the second magnetic field sensor 10B. In other words, the first magnetic field sensor 10A is arranged above the gap G between the first region 30A and the second region 30B. The second magnetic field sensor 10B is arranged on an outer periphery of the third region 30C.

Therefore, as illustrated in FIG. 3, a magnetic field M generated by the conductor 30 is applied to the first magnetic field sensor 10A in the first direction D1, and is applied to the second magnetic field sensor 10B in the second direction D2 opposite to the first direction D1.

When a magnetic field is applied to the magnetic field sensors 10, which are Hall elements, in a direction perpendicular to a direction of a current to be sensed, current carriers are subjected to the influence of a Lorentz force. With the Lorentz force, a Hall voltage is generated in a direction perpendicular to the current direction and the magnetic field direction. Each Hall element senses a magnetic field by outputting the Hall voltage as an output signal. The Hall voltage increases in proportion to a magnetic field strength. In addition, the sign (i.e., positive or negative) of the Hall voltage becomes opposite in response to a magnetic field with an opposite magnetic field direction.

The first magnetic field sensor 10A and the second magnetic field sensor 10B have identical characteristics. Regarding the direction in which the magnetic field M generated when a current flows through the conductor 30 is applied, the first direction D1 and the second direction D2 are opposite. Therefore, a voltage signal (i.e., a Hall voltage) output from the first magnetic field sensor 10A and a voltage signal output from the second magnetic field sensor 10B have opposite phases with opposite signs.

The output of the first magnetic field sensor 10A and the output of the second magnetic field sensor 10B have opposite phases as described above. Therefore, if the strengths of a magnetic field applied to the first magnetic field sensor 10A and the second magnetic field sensor 10B are substantially the same and differential combining (i.e., subtraction) is performed on the two outputs, the resulting output becomes approximately double the single output. When a noise magnetic field is applied to the entire current sensor 1, a noise magnetic field applied to the first magnetic field sensor 10A and a noise magnetic field applied to the second magnetic field sensor 10B are in the same phase. Thus, differentially combining the output of the first magnetic field sensor 10A and the output of the second magnetic field sensor 10B cancels out an output that is based on the noise magnetic fields. For differentially combining the two outputs, the electronic component 50 that is an IC chip on which an operational amplifier is mounted, for example, is used.

Figure 4:
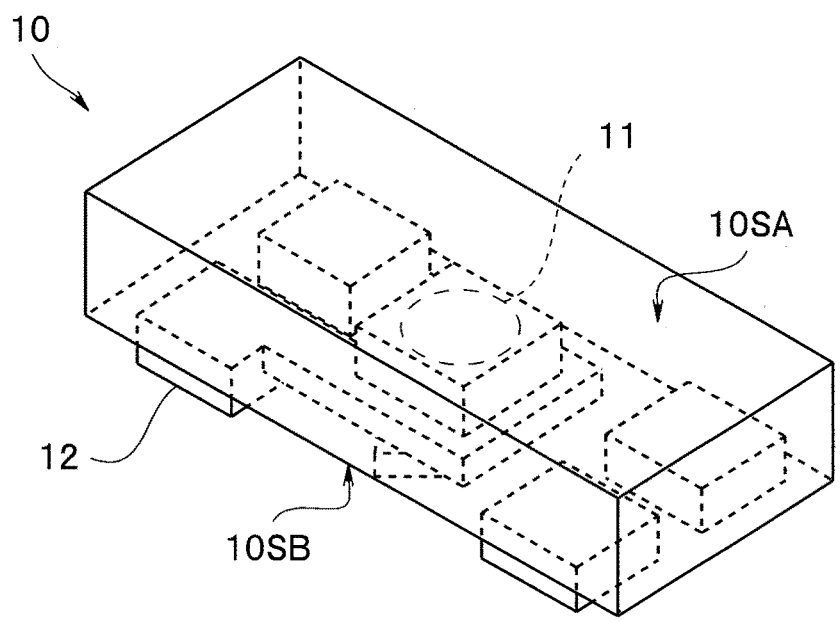
FIG. 4 is a see-through perspective view of a magnetic field sensing element of the embodiment.

As illustrated in FIG. 4, each magnetic field sensor 10 has a lower face 10SB with four external electrodes 12 and an upper face 10SA on the side opposite to the lower face 10SB. Two of the four external electrodes 12 receive a current to be sensed, and the other two external electrodes 12 output an output signal (i.e., a Hall voltage).

Each magnetic field sensor 10 is mounted on a face (i.e., a lower face in FIG. 2) of the conductor layer 41 on the side closer to the conductor 30. Therefore, a magnetic field, which is stronger than when the magnetic field sensor 10 is mounted on an upper face of the conductor layer 41, is applied to the magnetic field sensor 10.

A magnetism sensing portion (i.e., a magnetism sensing region) 11 is a sensor that can sense a magnetic flux generated. The magnetism sensing portion 11 of the first magnetic field sensor 10A is arranged above the gap G between the first region 30A and the second region 30B. The magnetism sensing portion 11 of the second magnetic field sensor 10B is arranged on the outer periphery of the third region 30C. In other words, the magnetism sensing portion 11 of the magnetic field sensor 10 (10A and 10B) does not overlap with the conductor 30 as seen in a direction parallel with a stacked direction of the conductor 30 and the first magnetic field sensor 10A or a stacked direction of the conductor 30 and the second magnetic field sensor 10B.

It is preferable that the distance WG between the first region 30A and the second region 30B be substantially the same as a size (i.e., outside diameter) D11 of the magnetism sensing portion 11 so as to allow the first magnetic field sensor 10A to sense a magnetic field with higher sensitivity. For example, the distance WG is preferably greater than or equal to 90% and less than or equal to 120% of the size D11 of the magnetism sensing portion 11.

Note that although the size of the magnetism sensing portion 11 is defined by the outside diameter herein, if the magnetism sensing portion is not circular (cylindrical) in shape, the size of the magnetism sensing portion is defined by an outside diameter of a circle having the same area as the magnetism sensing portion.

The magnetism sensing portions 11 are preferably arranged as close as possible to the third region 30C. However, the arrangement of the magnetic field sensors 10 is designed taking into consideration the external dimensions of the magnetic field sensors 10 and the arrangement of wire patterns of the multi-layer wiring board 60. Side faces of the two magnetic field sensors 10 may abut each other as long as the magnetism sensing portions 11 do not overlap with the third region 30C.

Note that as the width W30C of the third region 30C is smaller, a magnetic field applied to each magnetic field sensor 10 becomes stronger. However, the electric resistance of the conductor 30 becomes higher. Therefore, the lower limit of the width W30C is 300 µm, for example, based on specifications of the electric resistance of the current sensor 1. In contrast, as the width W30C of the third region 30C is larger, a magnetic field applied to each magnetic field sensor 10 becomes weaker. Therefore, the upper limit of the width W30C is 500 µm, for example.

When designing the current sensor 1, analyzing a magnetic field using a finite element method can optimize the width W30C with a good balance of detection sensitivity and band characteristics, for example. Needless to say, when a current to be sensed is a high-frequency signal with a frequency greater than or equal to 10 MHz and less than or equal to 30 MHz, for example, the influence of skin effect is not negligible.

Note that performing so-called chamfering on corner portions C30 of the first region 30A and the second region 30B at positions close to the second magnetic field sensor 10B along a straight line or a curved line is considered to be effective to shorten a current path. However, it is preferable that the first region 30A and the second region 30B be substantially rectangular in shape with the corner portions C30 having an angle of substantially 90 degrees. This is because in such a case, a magnetic field applied to the second magnetic field sensor 10B becomes stronger than when the corner portions C30 are chamfered.

Although a Hall element has been described as an example of each magnetic field sensor 10, it goes without saying that a magnetoresistive element (i.e., an MR element) may also be used.

Although a current sensing device has been described as an example of a current sensor, the current sensor 1 can also be used as an insulating coupler. In other words, a primary circuit including the conductor 30 and a secondary circuit including the magnetic field sensors 10 are electrically insulated from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A current sensor comprising:
a conductor including a first region, a second region, and a third region connecting an end of the first region and an end of the second region;
a first magnetic field sensor configured to receive a magnetic field generated by the conductor in a first direction;
a second magnetic field sensor configured to receive the magnetic field in a second direction opposite to the first direction; and
a multi-layer wiring board on which the first magnetic field sensor, the second magnetic field sensor, and an electronic component are mounted,
wherein:
the first magnetic field sensor and the second magnetic field sensor are arranged facing each other with the third region interposed between the first magnetic field sensor and the second magnetic field sensor,
a magnetism sensing portion of each of the first magnetic field sensor and the second magnetic field sensor does not overlap with the conductor, and
the multi-layer wiring board includes the conductor and a shielding layer disposed between the conductor and the first and second magnetic field sensors.

2. The current sensor according to claim 1, wherein the conductor is a U-shaped conductor.

3. The current sensor according to claim 2, wherein a gap between the first region and the second region is substantially identical to a size of the magnetism sensing portion.

4. The current sensor according to claim 3, wherein the first region and the second region are substantially rectangular in shape.

5. The current sensor according to claim 2, wherein a width of the third region is 300 to 500 μm.

6. The current sensor according to claim 1, wherein the electronic component is configured to differentially combine an output of the first magnetic field sensor and an output of the second magnetic field sensor.

7. The current sensor according to claim 1, wherein the first magnetic field sensor and the second magnetic field sensor are mounted on a face of a conductor layer of the multi-layer wiring board, the face being on a side closer to the conductor.

8. The current sensor according to claim 1, wherein each of the first magnetic field sensor and the second magnetic field sensor is a Hall element.

* * * * *